United States Patent
Masuko et al.

(10) Patent No.: US 9,953,894 B2
(45) Date of Patent: Apr. 24, 2018

(54) SEMICONDUCTOR DEVICE AND MANUFACTURING METHOD THEREOF

(71) Applicant: KABUSHIKI KAISHA TOSHIBA, Minato-ku, Tokyo (JP)

(72) Inventors: Shingo Masuko, Ishikawa (JP); Yoshiharu Takada, Ishikawa (JP); Kazuo Fujimura, Ishikawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/446,978

(22) Filed: Mar. 1, 2017

(65) Prior Publication Data

US 2018/0082918 A1    Mar. 22, 2018

(30) Foreign Application Priority Data

Sep. 16, 2016    (JP) .................... 2016-181793

(51) Int. Cl.
| | |
|---|---|
| H01L 23/36 | (2006.01) |
| H01L 23/367 | (2006.01) |
| H01L 29/08 | (2006.01) |
| H01L 29/417 | (2006.01) |
| H01L 21/48 | (2006.01) |
| H01L 23/373 | (2006.01) |
| H01L 23/544 | (2006.01) |
| H01L 21/78 | (2006.01) |
| H01L 21/304 | (2006.01) |
| H01L 21/02 | (2006.01) |
| H01L 21/311 | (2006.01) |

(52) U.S. Cl.
CPC .... *H01L 23/3675* (2013.01); *H01L 21/02164* (2013.01); *H01L 21/304* (2013.01); *H01L 21/31116* (2013.01); *H01L 21/4882* (2013.01); *H01L 21/78* (2013.01); *H01L 23/3736* (2013.01); *H01L 23/544* (2013.01); *H01L 29/0847* (2013.01); *H01L 29/41775* (2013.01); *H01L 2223/54453* (2013.01)

(58) Field of Classification Search
CPC ............................ H01L 23/3677; H01L 29/41
USPC ........................................................ 438/462
See application file for complete search history.

(56) References Cited

U.S. PATENT DOCUMENTS

| | | | |
|---|---|---|---|
| 9,263,534 B2 | 2/2016 | Takano | |
| 2006/0255452 A1* | 11/2006 | Wang | H01L 23/3677 257/714 |
| 2014/0016330 A1* | 1/2014 | Dohn | H01L 23/3677 362/373 |

FOREIGN PATENT DOCUMENTS

| | | |
|---|---|---|
| JP | 2008-034704 A | 2/2008 |
| JP | 2013-201413 A | 10/2013 |

* cited by examiner

*Primary Examiner* — Mark Prenty
(74) *Attorney, Agent, or Firm* — Foley & Lardner LLP

(57) ABSTRACT

A semiconductor device including: a semiconductor element, a substrate having a first surface on which the semiconductor element is provided, and a second surface located opposite the first surface, a metal species provided on the second surface, and a plated metal portion provided at least in part on the second surface on the metal species. The semiconductor device further includes a first region where the plated metal portion is provided and a second region where the plated metal portion is not provided are alternately arranged at a peripheral portion of the second surface.

6 Claims, 7 Drawing Sheets

US 9,953,894 B2

SEMICONDUCTOR DEVICE AND MANUFACTURING METHOD THEREOF

CROSS-REFERENCE TO RELATED APPLICATION

This application claims the benefit of and priority to Japanese Patent Application No. 2016-181793, filed Sep. 16, 2016, the entire contents of which are incorporated herein by reference.

FIELD

Embodiments described herein relate generally to a semiconductor device and a manufacturing method thereof.

BACKGROUND

A semiconductor device is provided in which a semiconductor element is provided on a front surface of a substrate and metal is provided on a rear surface of the substrate. The metal can function as, for example, an electrical connection component between the semiconductor element and an outside of the semiconductor device, and/or as a component for dissipating heat generated in or by the semiconductor element.

When the metal is provided on the entire rear surface of the substrate, metal burrs may be generated during a dicing process. In this case, metal peeling or cracking may occur.

Therefore, a method of forming the metal at a location away from a dicing line can be performed. However, in such a method, when a dicing line is formed on the rear surface of the substrate by etching or the like, alignment of both surfaces of the substrate in a photolithography process may be required, which can make manufacture difficult.

SUMMARY

In some embodiments, according to one aspect, a semiconductor device includes a semiconductor element, a substrate having a first surface on which the semiconductor element is provided, and a second surface opposite the first surface, a metal species provided on the second surface, and a plated metal portion provided at least in part on the second surface on the metal species. The semiconductor device further includes a first region where the plated metal portion is provided and a second region where the plated metal portion is not provided are alternately arranged at an end of the second surface.

In some embodiments, according to another aspect, a method of manufacturing a semiconductor device includes providing a substrate having a first surface and a second surface opposite the first surface, forming a semiconductor element on the first surface of a substrate, forming a metal species on the second surface of the substrate, forming at least part of a plated metal portion on the second surface using the metal species, and dicing the substrate along a line along which first regions where the plated metal portion is provided and second regions where the plated metal portion is not provided are alternately arranged.

DETAILED DESCRIPTION

Some example embodiments provide a semiconductor device and a manufacturing method thereof involving an improved manner of providing metal on a rear surface of a substrate of the semiconductor device.

Embodiments of the present invention will be described below with reference to the accompanying drawings. The described embodiments are examples and are not meant to be limiting.

(First Aspect)

Figure 1:
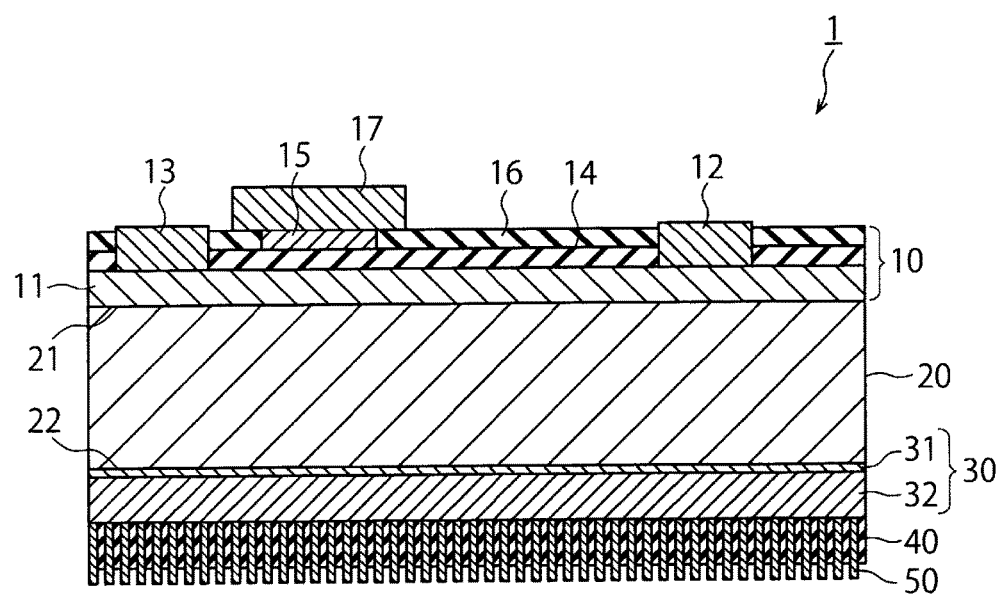
FIG. 1 is a cross-sectional view showing a schematic structure of a semiconductor device according to a first aspect.

FIG. 1 is a cross-sectional view showing a schematic structure of embodiments of semiconductor device according to a first aspect. Some embodiments of a semiconductor device 1 according to the first aspect include a semiconductor element 10, a substrate 20, a metal species 30, an insulating film 40 and a plated metal portion 50.

The semiconductor element 10 is a Metal Oxide Semiconductor (MOS) transistor. A drain 12, a source 13 and a gate insulating film 14 are provided on a semiconductor layer 11. A gate 15 and a passivation layer 16 are provided on the gate insulating film 14. A gate rewiring 17 is provided on the gate 15. When voltage is applied to the gate 15 through the gate rewiring 17, current flows from the drain 12 toward the source 13. The semiconductor element 10 need not be a MOS transistor—other types of semiconductor elements may be used.

The substrate 20 is, for example, a silicon substrate. The substrate 20 has a front surface 21 (first surface) on which the semiconductor element 10 is provided, and a rear surface 22 (second surface) opposite the front surface 21. The metal species 30 is provided on the rear surface 22.

The metal species 30 includes a metal layer 31 provided on the rear surface 22 of the substrate 20 and a metal layer 32 laminated on the metal layer 31. The metal layer 31 contains, for example, titanium (Ti), and the metal layer 32 contains, for example, copper (Cu). Metal contained in the metal layer 31 and the metal layer 32 can include, for example, any of zinc (Zn), palladium (Pd), nickel (Ni) and silver (Ag) in addition to titanium and/or copper. The metal species 30 may include at least one of these metals.

Figure 2:
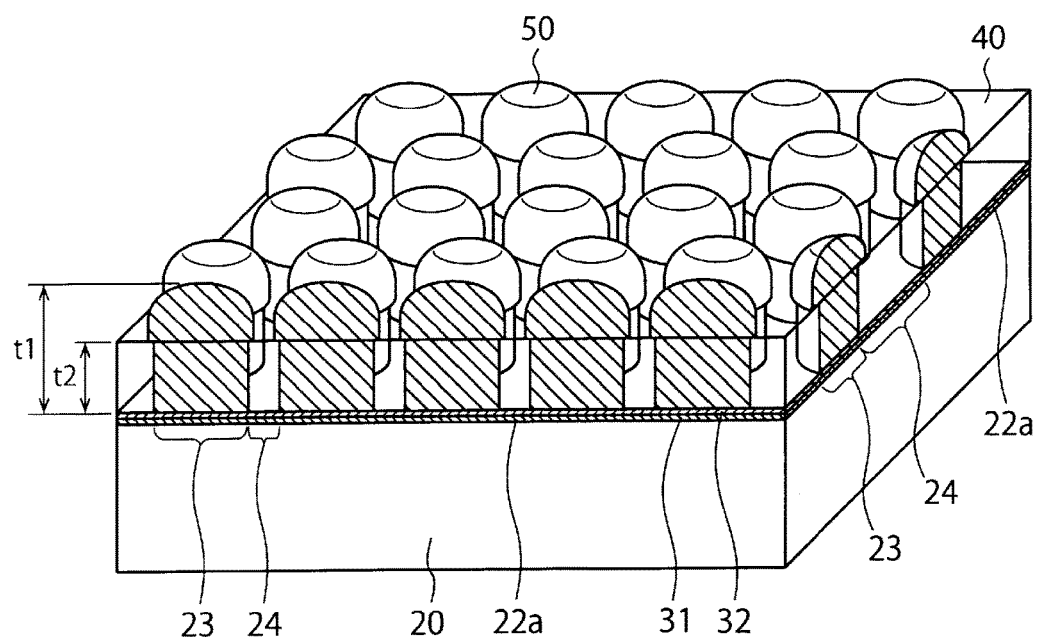
FIG. 2 is an enlarged perspective view showing plated metal portions shown in FIG. 1.

FIG. 2 is an enlarged perspective view of plated metal portions 50. The plated metal portions 50 are provided on the rear surface 22 and can be provided using the metal species 30 (e.g. by a plating process conducted on the metal species). The insulating film 40 may also be provided on the rear surface 22 on the metal species 30. In the depicted embodiments, the plated metal portions 50 are formed in a dot shape (e.g. may appear substantially circular or substantially elliptical from a top view). In other embodiments, at least one of the plated metal portions 50 may be formed in a different shape. The insulating film 40 is provided on one or more portions of the rear surface 22 where no plated metal portion 50 is provided.

Regions 23 (first regions) where the plated metal portion 50 is provided and regions 24 (second regions) where the plated metal portion 50 is not provided are alternately arranged at an end portion 22a of the rear surface 22 (which may correspond to at least a portion of a periphery of the rear surface 22). The region 24 has the insulating film 40 provided thereon. The end portion 22a may correspond to a dicing line where the substrate 20 is to be cut in a dicing process. Since the regions 23 and the regions 24 are alternately provided at the end portion 22a, the plated metal portions 50 are discontinuously arranged (e.g. are not in direct contact with each other). Therefore, metal burrs are less likely to be generated when the substrate 20 is diced.

Each of the plated metal portions 50 is bonded to a package, such as a semiconductor device package (not shown) with solder (not shown). The thickness t1 of the plated metal portion 50 is larger than the thickness t2 of the insulating film 40. When the thickness t1 is smaller than about 0.3 µm, a bonding strength between the plated metal portion 50 and the solder may be weak. When the thickness t1 is larger than about 80 µm, cracks may be generated in the plated metal portion 50 and in a wafer connected to the plated metal portion 50 (directly or indirectly). Therefore, in some embodiments it can be desirable that the thickness t1 of the plated metal portion 50 is about 0.3 µm or more and about 80 µm or less.

Figure 3:
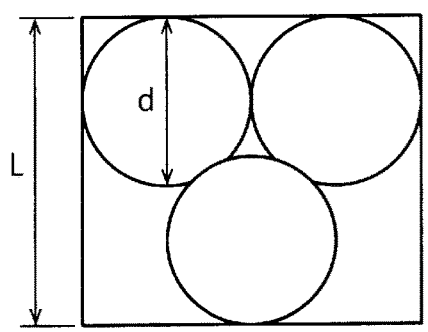
FIG. 3 is a plan view showing a layout of plated metal portions of a semiconductor device according to some embodiments.

FIG. 3 is a plan view for showing a maximum value of a diameter of the plated metal portion 50. If the number of the plated metal portions 50 arranged on the rear surface 22 is reduced, the diameter d (dot diameter) of the plated metal portions 50 may be increased.

As described above, the plated metal portion 50 is mounted with solder. In order to help the semiconductor device 1 to stand by itself, at least three plated metal portions 50 can be arranged in a substantially triangle shape as shown in FIG. 3. In the triangular arrangement, the diameter d of each of the plated metal portions 50 can be maximized in an area of a given size. The maximum value of the diameter d is about ½ of the length L of one side of the rear surface 22. The length L can correspond to the length of one side of the semiconductor chip. When the semiconductor chip is rectangular, the length L can correspond to the length of a short side of the rectangle.

In the depicted embodiments, the plated metal portions 50 each have a substantially circular planar shape (e.g. substantially circular cross section), and may have a dot shape when viewed from above. However, the planar shape of each of the plated metal portions 50 is not limited to a circular shape, and may be, for example, in a substantially polygonal shape. For example, the plated metal portion 50 may be formed in a substantially prismatic shape such as a triangular prism, and need not be limited to a column. Hereinafter, the term "prism" may refer to shapes including a shape in which a corner portion is rounded by plating treatment.

A manufacturing process of embodiments of the semiconductor device according to the first aspect will now be described with reference to FIGS. 4 to 8.

Figure 4:
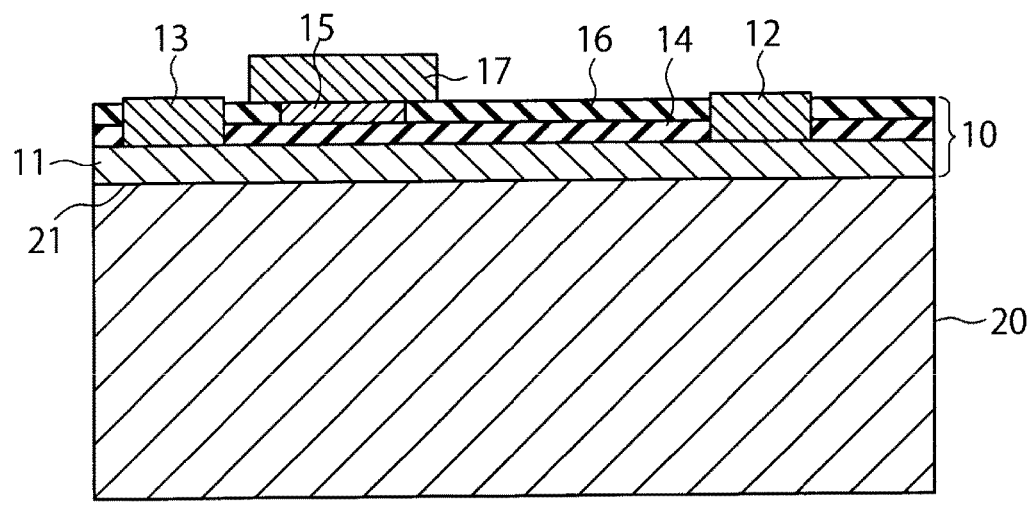
FIG. 4 is a cross-sectional view showing a manufacturing process of the semiconductor device according to the first aspect.

First, as shown in FIG. 4, the semiconductor element 10 is formed on the front surface 21 of the substrate 20. In this process, the substrate 20 has a substantially circular shape having, for example, a diameter of about 200 mm and a thickness of about 0.725 mm. The semiconductor element 10 can be formed by a semiconductor manufacturing process, that is, a so-called semiconductor pre-process, including, for example, a sputtering technique, an etching technique and the like.

Figure 5:
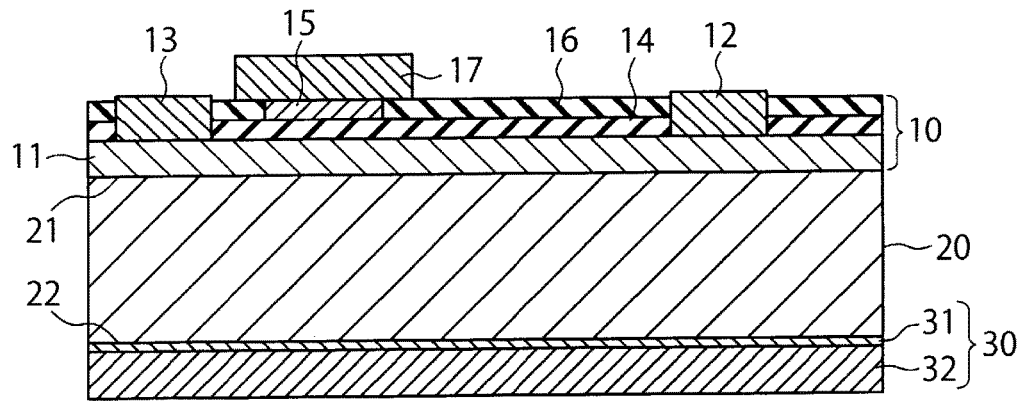
FIG. 5 is a cross-sectional view showing a manufacturing process subsequent to the manufacturing process shown in FIG. 4.

Next, as shown in FIG. 5, by grinding the rear surface of the substrate 20 using, for example, aback grinding device, the thickness of the substrate 20 (e.g. a wafer) is ground to have a thickness in a range from about 30 µm to about 90 µm. Subsequently, the rear surface is chemically ground to remove any deposit adhered to the rear surface during grinding. In this way, the rear surface 22 of the substrate 20 is formed. Subsequently, the metal species 30, that is, the metal layer 31 and the metal layer 32, are formed by using a sputtering device, for example. Thus, the metal species 30 having a thickness of about 100 nm is formed.

Figure 6:
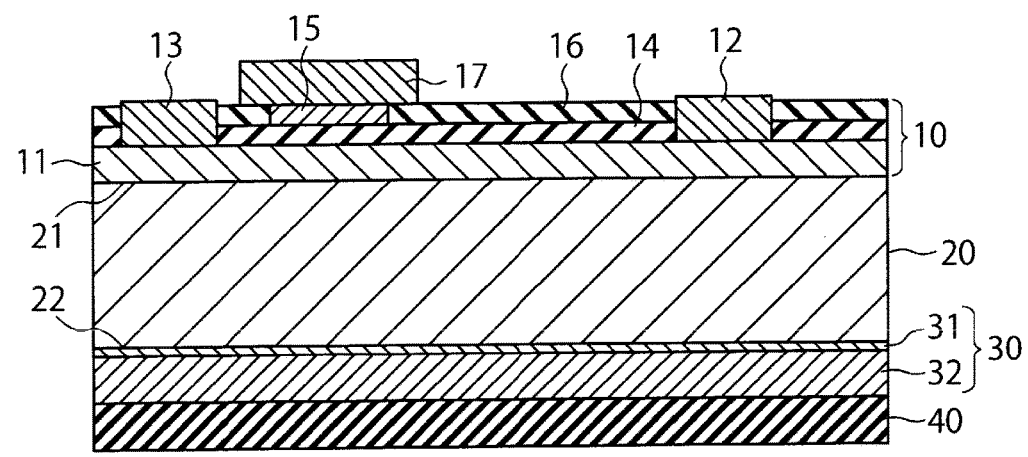
FIG. 6 is a cross-sectional view showing a manufacturing process subsequent to the manufacturing process shown in FIG. 5.

Next, as shown in FIG. 6, the insulating film 40 is formed on an exposed surface of the metal layer 32 (e.g. on the entire exposed surface). A silicon oxide film (made of, for example, $SiO_2$) is formed as the insulating film 40. The insulating film 40 may contain oxygen or nitrogen rather than, or in addition to, silicon oxide.

Figure 7:
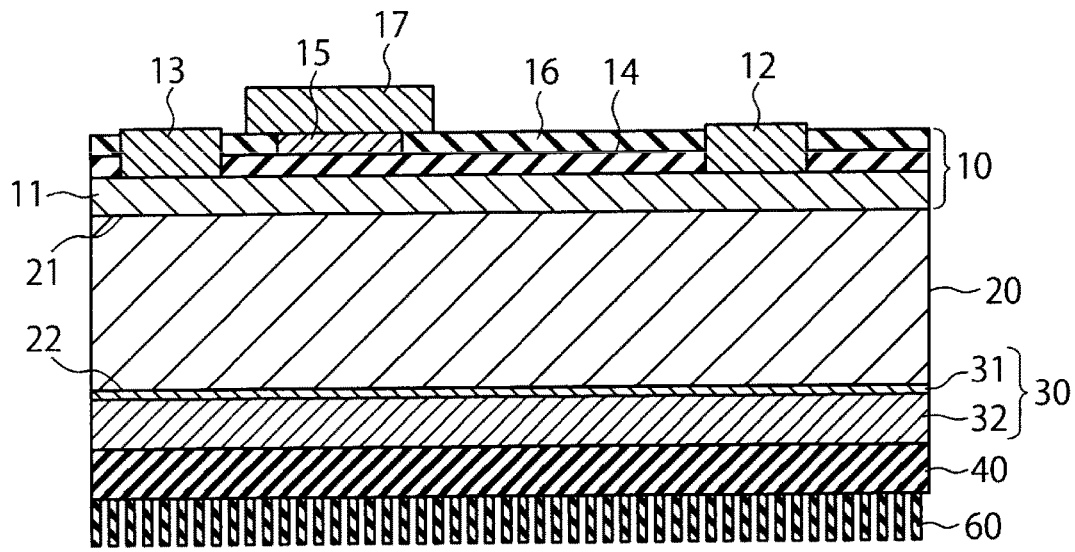
FIG. 7 is a cross-sectional view showing a manufacturing process subsequent to the manufacturing process shown in FIG. 6.

Next, as shown in FIG. 7, a resist 60 is formed on the insulating film 40 by using photolithography. Subsequently, the insulating film 40 is etched by using the resist 60 as a mask. The insulating film 40 may be dry-etched by using a plasma-assisted etching apparatus which releases an etching gas. Instead of dry etching, the insulating film 40 may be wet-etched using a chemical liquid. In this manner, the insulating film 40 is patterned. The locations where the insulating film 40 was etched correspond to a pattern of disposition of the plated metal portions 50.

Figure 8:
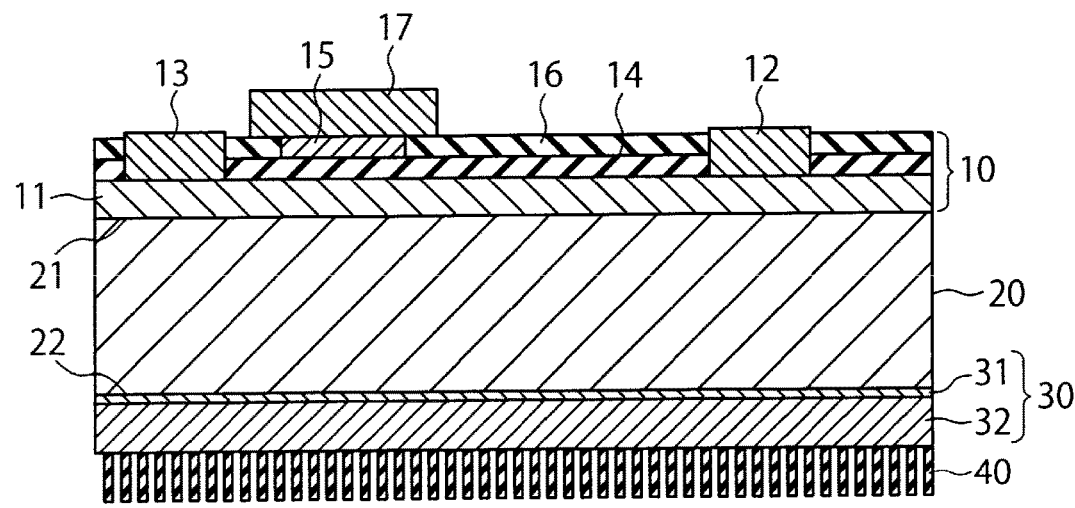
FIG. 8 is a cross-sectional view showing a manufacturing process subsequent to the manufacturing process shown in FIG. 7.

Next, as shown in FIG. 8, the resist 60 is removed. Thereafter, a plated metal portion 50 is formed, as shown in FIG. 1. The plated metal portion 50 may be formed between portions of the insulating film 40.

At the locations where the insulating film 40 was etched, the metal species 30 is exposed. In the depicted embodiments, the exposed metal species 30 is subjected to electrolytic plating treatment to form plated metal portions 50 in a dot shape. However, the method of forming the plated metal portions 50 is not limited to electrolytic plating. For example, the plated metal portion 50 may be formed by electroless plating, such as when the thickness t1 of each of the plated metal portions 50 is thin (for example, about 10 µm or less).

Next, the substrate 20 is diced using, for example, a blade. Thus, the substrate 20 is formed into one or more chips. In this process, the substrate 20 is diced along a line on which the plated metal portion 50 and the insulating film 40 are alternately arranged. As a result, as shown in FIG. 2, at the end portion 22a of the rear surface 22, the regions 23 where the plated metal portion 50 is provided and the regions 24 where the plated metal portion 50 is not provided (the region where the insulating film 40 is provided) are alternately formed.

When the substrate 20 is diced along a line on which the regions 23 and the regions 24 are alternately arranged, a place where the plated metal portions 50 are disposed discontinuously is diced. As a result, generation of burrs in the plated metal portions 50 is reduced, such that peeling and cracking of the plated metal portions 50 are less likely to occur than would otherwise be the case.

Further, in the depicted embodiments, there is no need to remove the plated metal portions 50 from the dicing line. Therefore, this eliminates a need to align both surfaces of the substrate in a photolithography process, which may be required when a dicing line is formed by etching or the like. Thus, it is possible to improve the manufacturing of the plated metal portions 50.

(First Variation)

Figure 9:
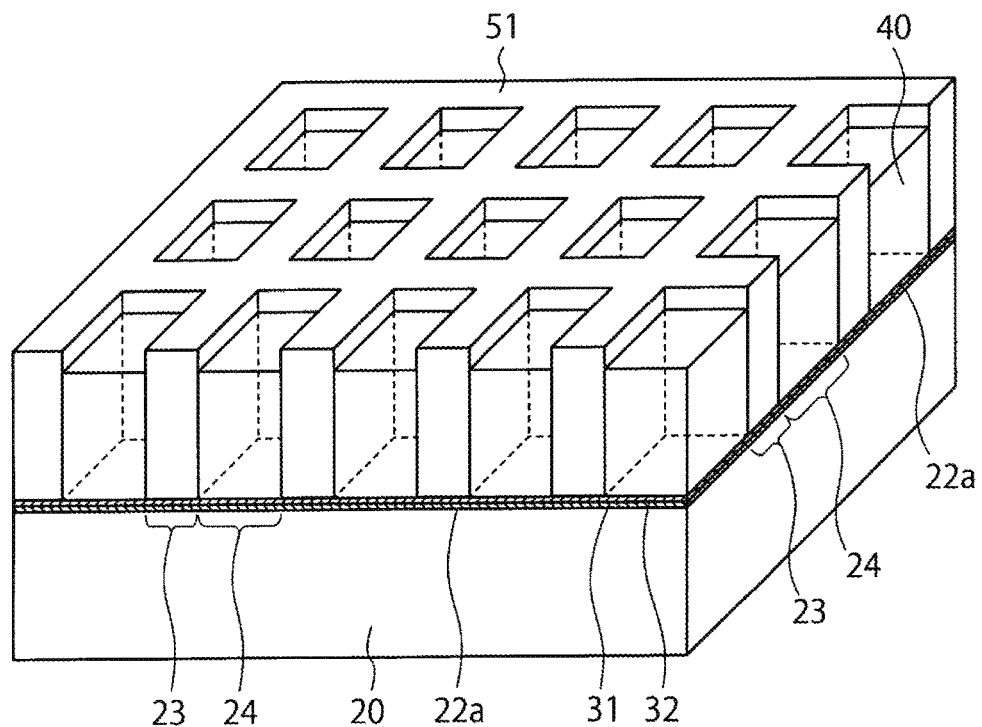
FIG. 9 is a perspective view showing a structure of a main part of a semiconductor device according to a first variation.

FIG. 9 is a perspective view showing a structure of a main part of a semiconductor device according to some embodiments of a first variation. In FIG. 9, components similar to those described above with respect to other embodiments of the first aspect are denoted by the same reference numerals, and detailed description thereof will be omitted.

According to some embodiments of the first variation, a substantially mesh-shaped (e.g. substantially mesh-shaped from a top view) plated metal portion 51 is provided on the rear surface 22 of the substrate 20. As described above with respect to other embodiments according to the first aspect, the mesh pattern is formed by patterning the insulating film 40 using the resist 60 (see FIGS. 7 and 8). According to some embodiments of the first variation, portions of the insulating film 40 which remain after patterning (e.g. which were not etched), where no plated metal portion 51 is provided, have a substantially quadrangular prism shape. In other embodiments, the portions of the insulating film 40 are shaped substantially like a column, or a prism other than a quadrangular prism.

The plated metal portion 51 can be formed by subjecting the metal species 30 to electrolytic plating treatment. Further, as described above with respect to other embodiments according to the first aspect, the plated metal portion 51 may be formed by electroless plating, for example, when the thickness of the plated metal portion 51 is thin.

As described above with respect to other embodiments according to the first aspect, according to the first variation, at the end portion 22a of the rear surface 22, the regions 23 where the plated metal portion 51 is provided and the regions 24 where the plated metal portion 51 is not provided (e.g. the regions where the insulating film 40 is provided) are alternately formed. That is, a place where the plated metal portion 51 is discontinuously disposed is diced. As a result, generation of burrs in the plated metal portion 51 is reduced, so that peeling and cracking of the plated metal portion 51 are less likely to occur than would otherwise be the case.

Further, according to the first variation, there is no need to remove the plated metal portion 51 from the dicing line. Therefore, it is not necessary to align both surfaces of the substrate in a photolithography process, which may be required when a dicing line is formed by etching or the like. Thus, it is possible to improve the manufacturing of the plated metal portion 51.

(Second Aspect)

Figure 10:
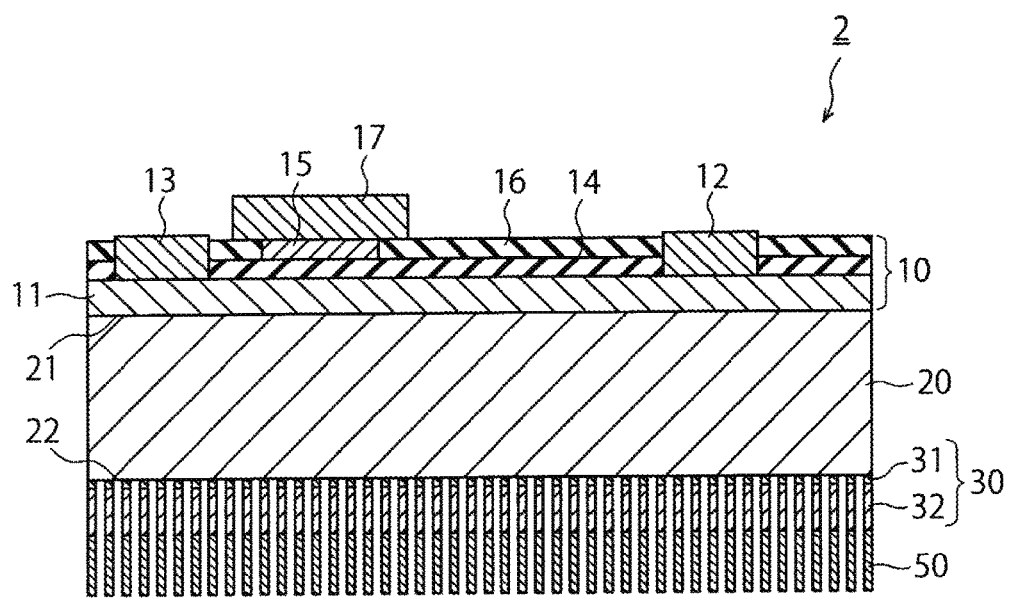
FIG. 10 is a cross-sectional view showing a schematic structure of a semiconductor device according to a second aspect.

FIG. 10 is a cross-sectional view showing a schematic structure of a semiconductor device according to some embodiments of a second aspect. In FIG. 10, components similar to those discussed above with respect to the first aspect are denoted by the same reference numerals, and detailed description thereof will be omitted.

A semiconductor device 2 according to some embodiments of the second aspect includes a semiconductor element 10, a substrate 20, a metal species 30 and a plated metal portion 50. The insulating film 40 described with respect to the first aspect is not provided.

Figure 11:
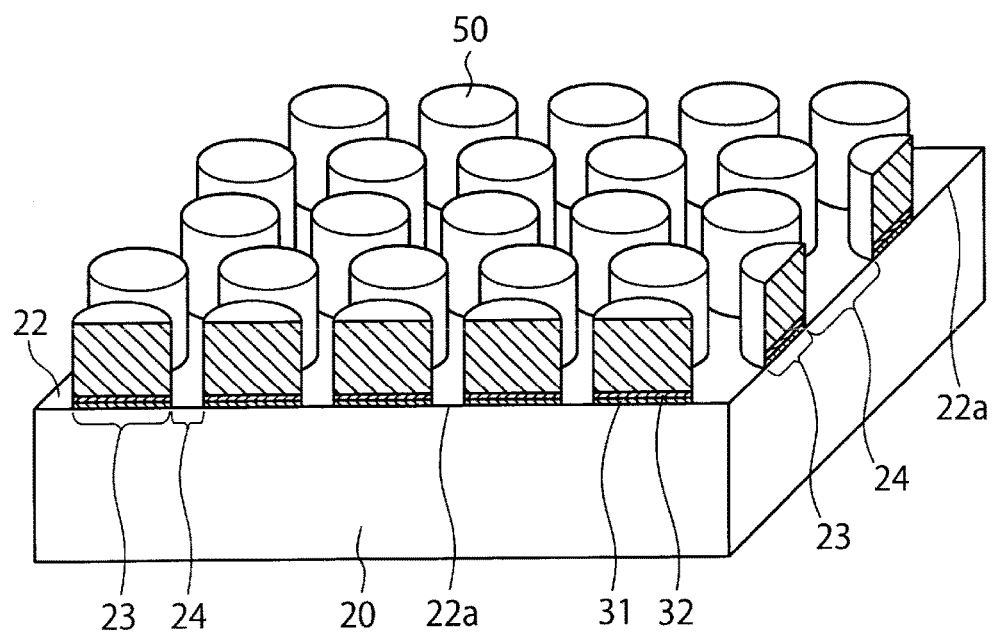
FIG. 11 is an enlarged perspective view of plated metal portions shown in FIG. 10.

FIG. 11 is an enlarged perspective view of plated metal portions 50 of the semiconductor device 2. As described above with respect to the first aspect, in the depicted embodiments, the plated metal portions 50 are provided in a dot shape on the rear surface 22 of the substrate 20 using the metal layer 31 and the metal layer 32 (e.g. by a plating process conducted on the metal layer 31 and/or the metal layer 32). Regions 23 where the plated metal portion 50 is provided and regions 24 where the plated metal portion 50 is not provided are alternately arranged at the end portion 22a of the rear surface 22.

On the other hand, unlike embodiments according to the first aspect, in the embodiments depicted in FIG. 11, the metal layer 31 and the metal layer 32 are patterned corresponding to the pattern of the plated metal portions 50 (and do not, for example, cover an entire rear surface 22 or an entire portion of an end portion 22a of the substrate 20).

Embodiments of a manufacturing process of the semiconductor device according to the second aspect will now be described with reference to FIGS. 12 and 13. The below description focuses on differences from embodiments according to the first aspect. The manufacturing process may include other steps, not described below, that are similar to steps described above with respect to embodiments according to the first aspect.

First, as in embodiments according to the first aspect, the semiconductor element 10 is formed on the front surface 21 of the substrate 20, and then, the metal layer 31 and the metal layer 32 are formed on the rear surface 22 of the substrate 20.

Figure 12:
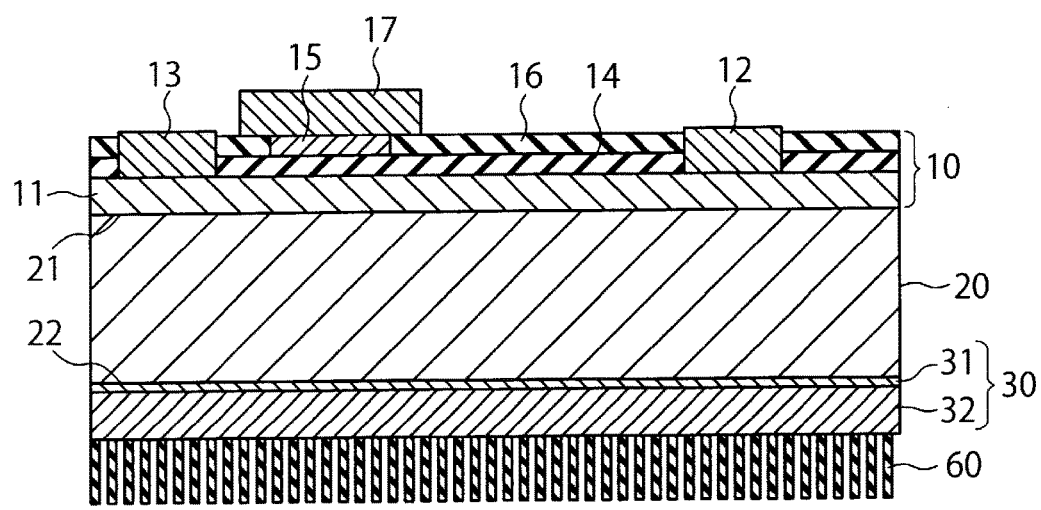
FIG. 12 is a cross-sectional view showing a manufacturing process of the semiconductor device according to the second aspect.

Next, as shown in FIG. 12, a resist 60 is formed on the metal layer 32 by photolithography. Subsequently, the metal layer 31 and the metal layer 32 are etched by using the resist 60 as a mask. Here, the metal layer 31 and the metal layer 32 may be dry-etched using etching gas, or may be wet-etched using a chemical liquid. In this manner, the metal layer 31 and the metal layer 32 are patterned. The portion of the rear surface 22 on which the metal layer 31 and the metal layer 32 remain corresponds to the pattern of the plated metal portions 50.

Figure 13:
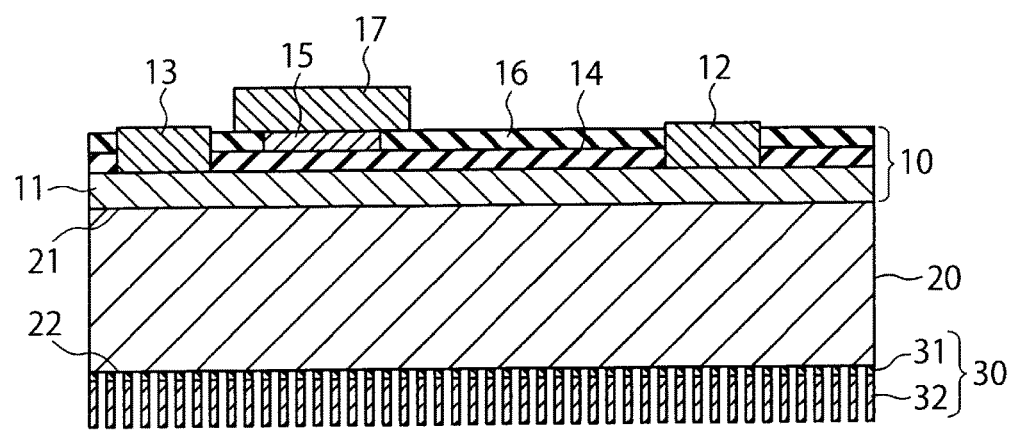
FIG. 13 is a cross-sectional view showing a manufacturing process subsequent to the manufacturing process shown in FIG. 12.

Next, as shown in FIG. 13, the resist 60 is removed. Thereafter, as shown in FIG. 10, a plated metal portion 50 is formed.

In the depicted embodiments, the metal layer 31 and the metal layer 32 remaining on the rear surface 22 are subjected to electrolytic plating treatment to form plated metal portions 50 in a dot shape. The plated metal portion 50 may be formed by electroless plating, such as when the thickness of each of the plated metal portions 50 is thin. As in embodiments according to the first aspect, the plated metal portion 50 may be formed substantially in the shape of a column, or some other shape, such as substantially in the shape of a prism (e.g. substantially in the shape of a triangular prism).

After the formation of the plated metal portions 50, as in embodiments according to the first aspect, the substrate 20 is diced along a line on which the plated metal portions 50 are discontinuously arranged. As a result, as shown in FIG. 11, the regions 23 where the plated metal portion 50 is provided and the regions 24 where the plated metal portion 50 is not provided are alternately formed on the end portion 22a of the substrate 20.

According to the embodiment described above, a pattern is formed in advance for the metal layer 31 and the metal layer 32, and the plated metal portion 50 is formed in accordance with the pattern. With such a manufacturing method, at the end portion 22a of the rear surface 22, the regions 23 where the plated metal portion 50 is provided and the regions 24 where the plated metal portion 50 is not provided are alternately formed. Thus, a place where the plated metal portions 50 are discontinuously arranged can be diced. As a result, generation of burrs in the plated metal portions 50 is reduced, such that peeling and cracking of the plated metal portions 50 are less likely to occur than would otherwise be the case.

Further, in the depicted embodiments, there is no need to remove the plated metal portions 50 from the dicing line. Therefore, this eliminates a need for alignment of both surfaces of the substrate in a photolithography process, which can be required when a dicing line is formed by etching or the like. Thus, it is possible to improve the manufacturing of the plated metal portions 50.

(Second Variation)

Figure 14:
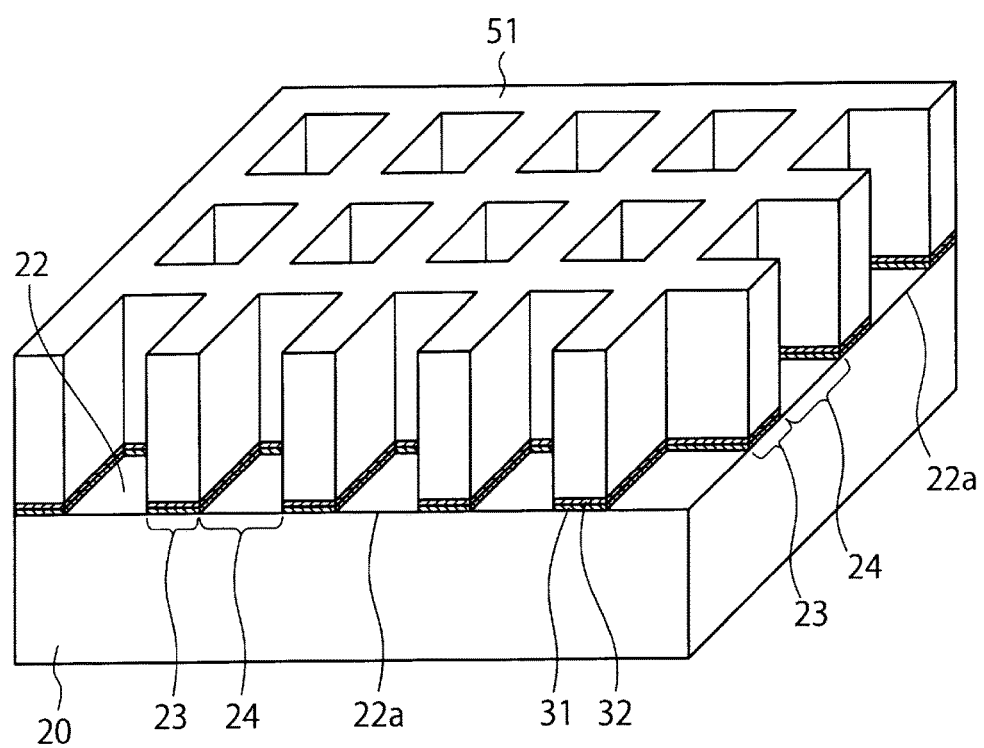
FIG. 14 is a perspective view showing a structure of a main part of a semiconductor device according to a second variation.

FIG. 14 is a perspective view showing a structure of a main part of a semiconductor device according to a second variation. In FIG. 14, components similar to those described above with respect to embodiments of the second aspect are denoted by the same reference numerals, and detailed description thereof will be omitted.

In the second variation, a substantially mesh-shaped plated metal portion 51 is provided on the rear surface 22 of the substrate 20. As in other embodiments according to the second aspect, the mesh pattern is formed by patterning the metal layer 31 and the metal layer 32 using the resist 60 (see FIGS. 12 and 13). At this time, a region where no plated metal portion 51 is provided may be formed substantially in the shape of a column or a prism.

The plated metal portion 51 can be formed by subjecting the metal layer 31 and the metal layer 32 to electrolytic plating treatment. As in other embodiments according to the second aspect, the plated metal portion 51 may be formed by electroless plating, such as when the thickness of the plated metal portion 51 is thin.

As in other embodiments according to the second aspect, according to the second variation, at the end portion 22a of the rear surface 22, the regions 23 where the plated metal portion 51 is provided and the regions 24 where the plated metal portion 51 is not provided are alternately formed. That is, a place where the plated metal portion 51 is discontinuously arranged is diced. As a result, generation of burrs in the plated metal portion 51 is reduced, such that peeling and cracking of the plated metal portion 51 are less likely to occur than would otherwise be the case.

Further, according to the second variation, there is no need to remove the plated metal portion 51 from the dicing line. This eliminates a need to align both surfaces of the substrate in a photolithography process, which may be required when a dicing line is formed by etching or the like. Thus, it is possible to improve the manufacturing of the plated metal portion 51.

In the description of some embodiments, a component provided "on" another component can encompass cases where the former component is directly on (e.g., in physical contact with) the latter component, as well as cases where one or more intervening components are located between the former component and the latter component.

While certain embodiments and variations have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure. Moreover, some or all of the above described embodiments can be combined when implemented.

What is claimed is:

1. A semiconductor device, comprising:
   a semiconductor element;
   a substrate having a first surface on which the semiconductor element is provided, and a second surface opposite the first surface;
   a metal species provided on the second surface; and
   a plated metal portion provided at least in part on the second surface on the metal species;
   wherein first regions where the plated metal portion is provided and second regions where the plated metal portion is not provided are alternately arranged at a peripheral portion of the second surface.

2. The semiconductor device according to claim 1, further comprising an insulating film provided on the second regions.

3. The semiconductor device according to claim 2, wherein a pattern of the plated metal portion is in a dot or mesh shape.

4. The semiconductor device according to claim 2, wherein a thickness of the plated metal portion is 0.3 μm or more and 80 μm or less.

5. The semiconductor device according to claim 1, wherein a pattern of the plated metal portion is in a dot or mesh shape.

6. The semiconductor device according to claim 1, wherein a thickness of the plated metal portion is 0.3 μm or more and 80 μm or less.

* * * * *